United States Patent [19]

Berthiaume

[11] Patent Number: 4,914,396
[45] Date of Patent: Apr. 3, 1990

[54] PWM WAVEFORM GENERATOR

[75] Inventor: Ronald J. Berthiaume, Lafayette, Colo.

[73] Assignee: Acme Electric Corporation, East Aurora, N.Y.

[21] Appl. No.: 98,972

[22] Filed: Sep. 21, 1987

[51] Int. Cl.$^4$ .................. H03B 19/00; H03L 5/00; H03K 5/153; H03K 7/00

[52] U.S. Cl. ........................... 328/14; 328/31; 307/264; 307/350; 307/529; 332/109

[58] Field of Search .............. 332/9 R; 328/14, 27, 328/31, 58, 111, 115; 307/264, 265, 271, 529, 234, 350

[56] References Cited

U.S. PATENT DOCUMENTS

| | | | |
|---|---|---|---|
| 2,968,010 | 1/1961 | Case, Jr. ................. | 332/9 R |
| 3,489,853 | 1/1970 | Lang ..................... | 332/9 R |
| 3,617,941 | 11/1971 | DeLellis, Jr. .......... | 332/16 R |
| 3,659,048 | 4/1972 | Zuerblis et al. ....... | 307/227 |
| 3,659,087 | 4/1972 | Green et al. ........... | 328/14 |
| 3,660,766 | 5/1972 | Hilliard, Jr. .......... | 328/14 |
| 3,668,562 | 6/1972 | Fritkin .................. | 332/9 R |
| 3,773,975 | 11/1973 | Koziol .................. | 332/9 R |
| 3,793,597 | 2/1974 | Toman .................. | 332/9 R |
| 3,824,498 | 7/1974 | McBride ............... | 332/9 R |
| 3,991,389 | 11/1976 | Dwire et al. ........... | 332/9 R |
| 3,999,049 | 12/1976 | Roche et al. .......... | 328/14 |
| 4,138,632 | 2/1979 | Pauwels et al. ....... | 332/9 R |
| 4,259,648 | 3/1981 | Farrow ................. | 332/9 R |
| 4,494,073 | 1/1985 | Sorgi .................... | 307/529 |
| 4,504,802 | 3/1985 | Heatherington ....... | 332/9 R |

OTHER PUBLICATIONS

"An Algebraic Algorithm for Microcomputer-Based (Direct) Inverter Pulsewidth Modulation" Yoone Ho Kim/Mehrdad Ehsani, IEEE Transactions on Industry Applications, vol. 1A-23, No. 4, Jul./Aug. 1987; pp. 654-660.

Primary Examiner—Stanley D. Miller
Assistant Examiner—Trong Quang Phan
Attorney, Agent, or Firm—Pearne, Gordon, McCoy & Granger

[57] ABSTRACT

A PWM waveform generator generates the digitized waveform which may control an inverter so that the inverter output is pulse width modulated and generates a sine wave after filtering. A frequency controlling means includes a cycle clock cycling an address counter which addresses step data in a ROM, and the ROM data is fed to a PWM counter. This PWM counter has a clock input to reset a flip-flop and the output passes through a polarity switch to obtain the digitized waveform. This frequency controlling means is modified by an amplitude controlling means wherein the PWM counter is clocked at a variable frequency rate to control the width of the pulses directly proportional to the desired effective amplitude of the output waveform. The foregoing abstract is merely a resume of one general application, is not a complete discussion of all principles of operation or applications, and is not to be construed as a limitation on the scope of the claimed subject matter.

15 Claims, 3 Drawing Sheets

PWM WAVEFORM GENERATOR

BACKGROUND OF THE INVENTION

The prior art has described different circuits for obtaining a synthesized sine wave such as for use in frequency shift keying, as in U.S. Pat. No. 3,991,389. Other patents have disclosed means to digitally generate a sine wave, such as U.S. Pat. Nos. 3,659,048 and 3,773,975. Still further, patents of the prior art have suggested a sine or cosine table in the read only memory to be looked up to generate a sine wave, such as in U.S. Pat. Nos. 3,617,941; 3,824,498; 4,259,648; and 4,504,802. Typically, the U.S. Pat. No. 3,793,597 disclosed digital sample points of various modulation levels stored in a ROM and read out in timed sequence to modulate a carrier at a constant depth of modulation. Kim et al. writing in *IEEE Transactions on Industry Applications*, July 1987, page 654, disclose digital pulse width modulation with sine wave data stored in a ROM. Different modulation levels are disclosed as requiring a very large memory for control of the output voltage.

SUMMARY OF THE INVENTION

The problem to be solved, therefore, it how to construct a PWM waveform generator wherein the large memory requirement of the prior art is eliminated, yet the effective amplitude of the output sine wave may readily be controlled.

This problem is solved by a pulse width modulated waveform generator comprising in combination, frequency controlling means including means to establish a series of pulses of substantially constant amplitude and of a width directly in accordance with data of the amplitude of steps of a desired output waveform at a selected frequency, and amplitude controlling means connected to modify the output of said frequency controlling means to control the width of said pulses directly proportional to the desired effective amplitude of the output waveform.

Accordingly, an object of the invention is to provide both frequency and amplitude control means in a PWM waveform generator.

Another object of the invention is to provide a PWM waveform generator wherein first a PWM output is generated at a selected frequency, and it is then modified in pulse width to control the effective amplitude of the output waveform.

Other objects and a fuller understanding of the invention may be had by referring to the following description and claims, taken in conjunction with the accompanying drawing.

DESCRIPTION OF THE PREFERRED EMBODIMENT

Figure 1:
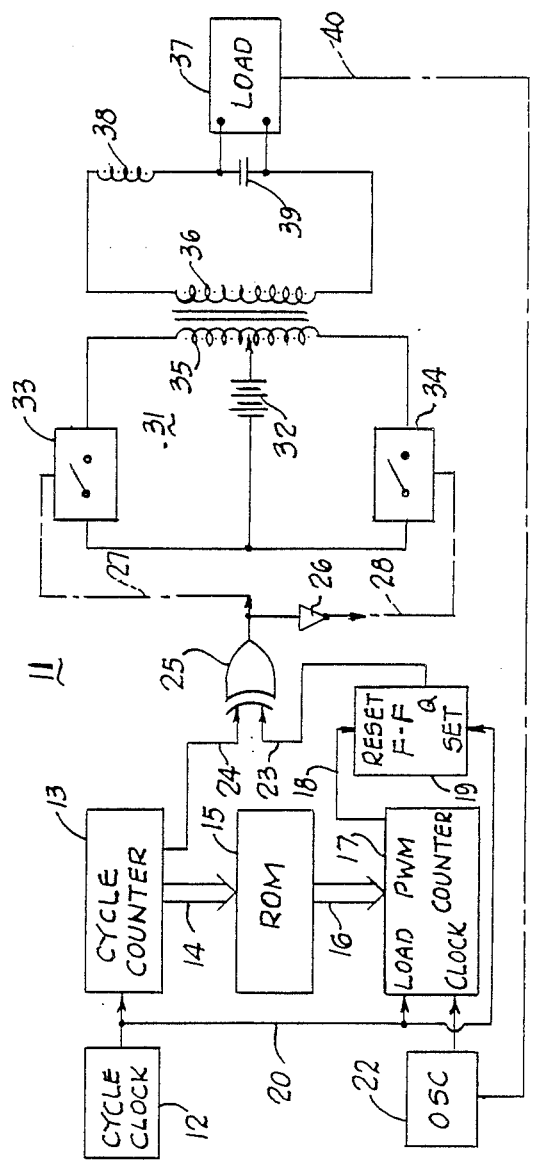
FIG. 1 is a block diagram of the circuit of the waveform generator.

FIG. 1 illustrates a schematic block diagram of a PWM waveform generator 11. This circuit generates a pulse width modulated output of a digitized waveform. The effective amplitude of the resultant pulse width modulated waveform is then adjustable by adjusting the pulse width by means of an analog control voltage.

The waveform generator is useful in generating a sine wave or stepped sine wave for control of an inverter, for example, and this might be in an uninterruptible or standby power supply wherein the sine wave output of the inverter is controlled not only in frequency but also in effective amplitude.

Additionally, the described circuit or technique may be used to synthesize any periodic waveform that can be digitized.

The PWM waveform generator 11 utilizes digitized half-cycle sine wave data stored in a ROM. The ROM data is loaded into a PWM counter during the beginning of each sub-cycle and an output flip-flop is set. A PWM clock signal is used to clock the PWM counter, and when it completes its count, a carry is generated that resets the flip-flop. The amount of time that the flip-flop is on is therefore a function directly of the ROM data and inversely of the PWM clock frequency.

The circuit provides a means to control the effective amplitude of the waveform by utilizing a PWM clock frequency which is variable. A polarity control signal from the sub-cycle address counter is used to define whether the PWM output is a positive or negative half-cycle by inverting the output on negative half-cycles. Complementary positive and negative drive signals are generated to drive the semiconductor switches in an inverter. The load of the inverter may have a DC feedback signal to control the PWM clock frequency.

In FIG. 1, a cycle clock 12 has an output to a cycle counter 13, which in turn has a parallel output on N address lines 14 to a ROM 15. The ROM has a parallel output on M output lines 16 to a PWM counter 17, which may be an up counter, but is shown as a down counter and has a serial output on line 18 to a reset of a flip-flop 19. The cycle clock 12 also has an output on line 20 to a load input of the PWM counter 17. An oscillator 22 has an output to a clock input of the PWM counter 17, and the line 20 from the cycle clock 12 also has an input to the set input of the flip-flop 19. The flip-flop has an output, in this case shown as a Q output leading to one input 23 of an Exclusive OR polarity switch 25. A second switch 24 of this polarity switch is from the N+1 output of the cycle counter 13. An inverter 26 is connected to the output of the polarity switch 25. The aforementioned items 12 through 26 may be considered to be frequency controlling means to establish a series of pulses of substantially constant amplitude and of a width directly in accordance with data of the amplitude of steps of a desired output waveform at a selected frequency.

The PWM waveform generator also includes amplitude controlling means which is connected to modify the output of the frequency controlling means to control the width of all of the pulses directly proportional to the desired effective amplitude of the output waveform. This amplitude controlling means includes the fact that the oscillator 22 is a variable frequency oscillator, and in this embodiment is a voltage-controlled oscillator or volts-to-frequency converter.

As an example of an application for this pulse width modulated waveform generator, the generator has outputs on lines 27 and 28 to control an inverter 31. This may be many forms of inverter, and the block diagram of FIG. 1 shows a DC source 32, such as a battery or rectifier, acting through a positive drive switch 33 and a negative drive switch 34 to a transformer winding 35.

These switches 33 and 34 may be the usual semiconductor switch such as a transistor or thyristor, and the output lines 27 and 28 control the alternative conduction of these switches. The inverter 31 may include a transformer secondary winding 36 supplying an alternating voltage to a load 37 through an inductive filter 38, and with a capacitor filter 39 across the load 37. The load also has a feedback 40, such as a DC current or voltage feedback, to control the frequency output of the oscillator 22.

Figure 2:
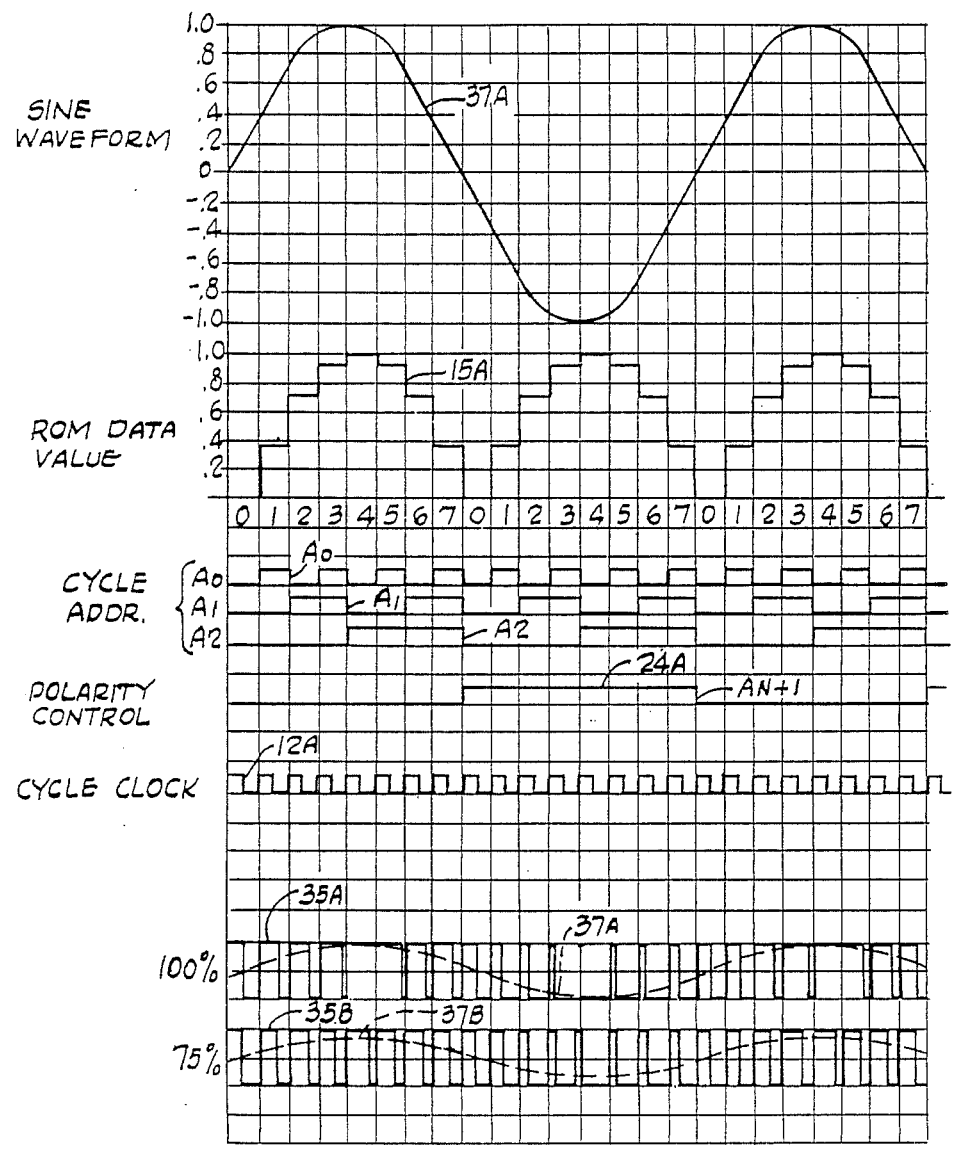
FIG. 2 is a graph of the various waveforms in the circuit.
Figure 3:
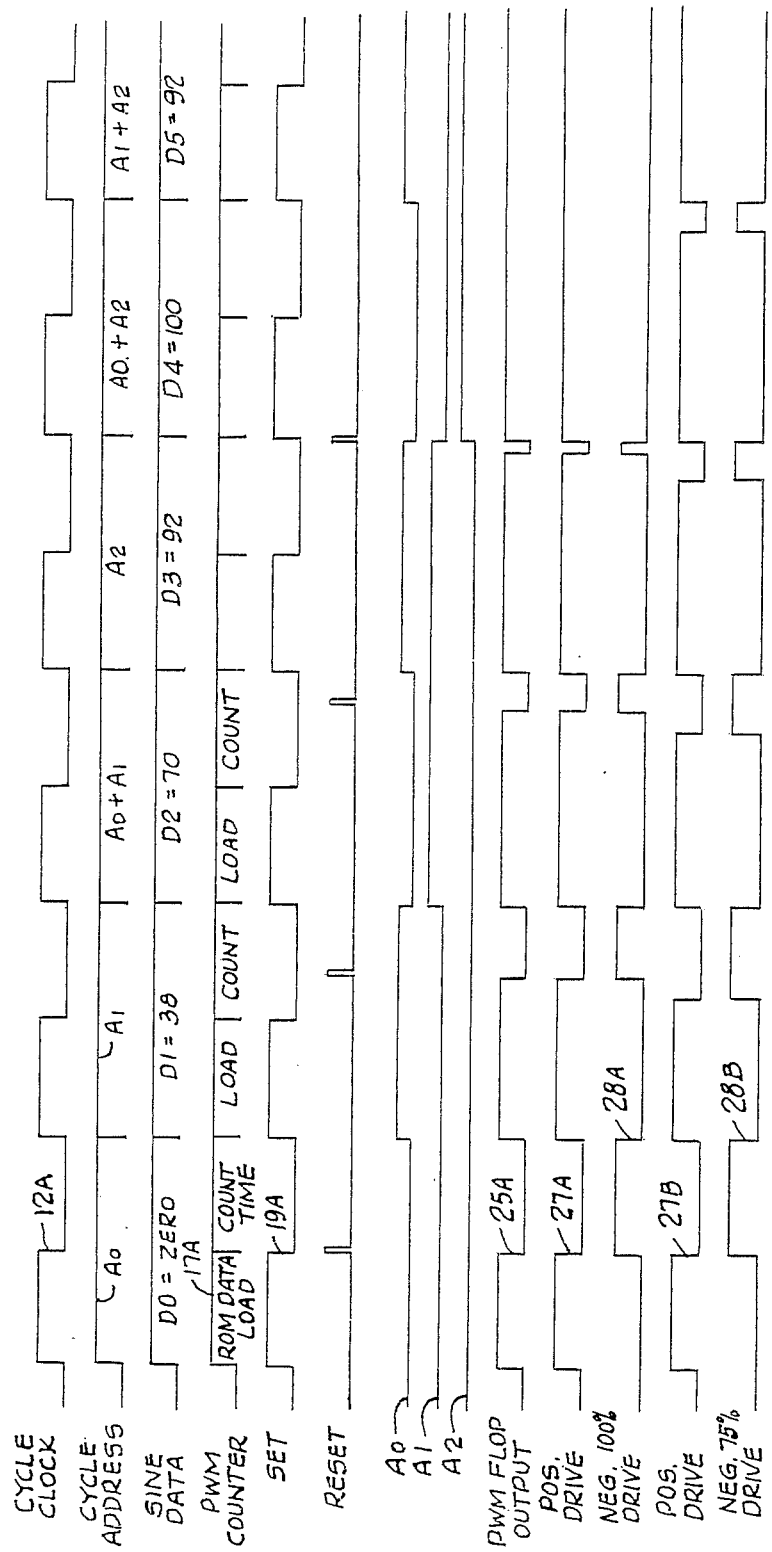
FIG. 3 is a graph of various waveforms with an enlarged time base.

FIGS. 2 and 3 show an example of one possible operation of this waveform generator circuit 11. FIG. 2 shows a sine waveform 37A which is the desired sinusoidal waveform of voltage applied to the load 37 at a selected frequency. As an example, this might be a standby power supply supplying a load at a 60 Hz frequency and with a variable amplitude in accordance with the requirements of this load 37. Further, in this example, the cycle clock would then be selected to operate at the desired output frequency times the number of steps of a desired output waveform. The cycle clock 12 may be a crystal-controlled clock, for example, with a square wave output 12A shown in FIG. 2, or shown in FIG. 3 to an expanded time base. This is a 50% duty cycle of 50% of the time on and 50% of the time off. The ROM 15 may have an eight-step data per half-cycle, shown as stepped wave 15A in FIG. 2. The cycle clock 12 cycles the cycle counter 13 and has parallel outputs on the N address lines 14. In this example of eight steps, the address lines A0, A1 and A2 are shown in the graph of FIG. 2, and there are three such address lines for these eight steps. Further, the cycle clock 12, acting through the line 20, loads the PWM counter 12 during the first half of the clock cycle, and also sets the flip-flop 19.

The cycle counter 13 in an address counter for the ROM 15, addressing any one of eight addresses in the ROM, for the calculated height of the various steps for the waveform 15A. This cycle counter also has a polarity control signal on line 24 which is AN+1 to control the positive and negative halves of the output sine wave.

The ROM 15 contains the digitized reference waveform 15A in addresses equal in number to the number of steps in a half-sine wave. Each address contains a binary word representing the amplitude, at that time, of the reference waveform 37A. The values stored in the ROM control the output wave shape.

The PWM counter 17 is a parallel load counter loaded from the M output lines 16. These lines are sufficient in number to supply the step data in the desired degree of specificity. In the above example of eight steps, with step data of values from 0 to 100, seven lines of digital values $2^0$ to $2^6$, i.e., 1 to 64, would permit 128 different calculated height data, sufficient for this 0 to 100 value of the steps in this example. A maximum value of 127 may be used for greater amplitude accuracy. This PWM counter 17 is loaded with the ROM data at the beginning of each cycle of the cycle clock 12 (see curve 17A in FIG. 3). As shown in FIG. 3, during the first halfcycle of the cycle clock, the cycle address A0 directs that the sine data D0 is loaded into the PWM counter 17. Then during the first half of the second cycle, the cycle address A1 directs that data D1 is loaded into the PWM counter, etc. Each address from the ROM 15 contains a binary word representing the amplitude, at that time, of the reference waveform. The counter, during the second half of the cycle of the cycle clock, counts down toward zero. An up counter could also be used for the application with a corresponding change in ROM data. When the counter counts down to zero, it generates a carry on line 18 that resets the flip-flop 19. The time required to count out is directly proportional to the value of the ROM data loaded into the counter 17 and inversely proportional to the PWM clock rate from oscillator 22.

The voltage-controlled oscillator 22 is used to generate the PWM clock for the PWM counter 17. The frequency of this oscillator 22 controls the amplitude of the output waveform, and hence is the amplitude controlling means.

The flip-flop 19 controls the PWM ON time. The output is taken from the Q output of the flip-flop and it is set, i.e., held high, during the first half of the cycle of the cycle clock (see curve 19A of FIG. 3). The PWM ON time is therefore equal to one-half cycle clock plus the PWM counter count out time:

$$\text{Ton} = \frac{\text{cycle clock}}{2} + PWM \text{ count}$$

The polarity switch 25 is used to set the polarity of the output waveform 25A, shown in FIG. 3. The PWM output signal varies from 50% to 100%. This is the signal on line 27, as shown in curve 27A of FIG. 3. This signal modulates the positive drive switch 33 of the inverter 31 from 50% to 100%, and the negative drive switch 34, from 50% to 0%. When the signal is inverted by the polarity switch 25, the positive drive switch varies from 50% to 0%, and the negative drive switch 34 varies from 50% to 100%. The graph of the voltage from inverter 26 on line 28 is shown in graph 28A of FIG. 3.

The curves 27A and 28A of FIG. 3 are for 100% modulation or the maximum effective amplitude of the output sine wave 37A applied to the load 37. In the above example, the oscillator 22 would be operating at a frequency of 1920 Hz. To review the above example, the cycle clock operates at 960 Hz, loads data into the PWM counter 17 during one half-cycle, which is 1/1920 seconds, and then counts the time during another half-cycle, of 1/1920 seconds. The calculated height at the peak of the stepped wave 15A of FIG. 2 is 100 units. In order to have a serial count output from the PWM counter 17 of 100 before there is a carry on line 18, the oscillator 22 needs to run at a minimum of 192,000 Hz, or 100 times 1920. The combined output from the positive and negative drive switches 33 and 34 will then appear on the transformer winding 35 as voltage wave 35A shown in FIG. 2. The dotted line appearing on graph 35A is a sine wave 37A, namely, the effective amplitude of the resulting sine wave applied to the load after being filtered at the filter 38, 39.

It will be noted from graph 35A in FIG. 2 that the two consecutive pulses at the peak of the wave 37A are merged together for this 100% modulation. This is with an even number of steps per half-cycle. Graph 35B in FIG. 2 illustrates 75% modulation, wherein the resultant sine wave 37B after filtering is only 75% of the maximum obtained in curve 37A. To accomplish this, each of the pulses in the positive half-cycle is only 75% of the width of the pulses for 100% modulation, except for those pulses establishing zero output voltage. In the negative half-cycle, the pulse widths are narrowed also by 75%, considering the inversion of the pulses by the polarity switch 25. In FIG. 3, the positive and negative drive pulses 27B and 28B illustrate the output voltages on lines 27 and 28, respectively, for this 75% modulation. In the above example, oscillator 22 would operate at one-third higher frequency, namely 256,000 Hz, in order to modify the frequency controlling means by the amplitude control of the variable oscillator 22 to achieve this 75% modulation.

A normal point of operation of the inverter 31 would be at about 75% modulation, so that both load increases and decreases could be accommodated readily.

In a PWM waveform generator constructed in accordance with the principle of this invention, the ROM data value had 64 steps per half-cycle rather than the 8 steps shown, in order to obtain a much closer approximation to a sine wave, and hence reduce the size and expense of the low pass filter 38,39. With 64 steps, the cycle clock 12 operates at 7680 Hz, the N address lines 14 are six in number, for 64 bits of address information, the M output lines 16 remain 7 in number, and the variable frequency oscillator 22 operates at a minimum of 1.536 MHz, for 100% modulation. Except for the pulses establishing the zero crossing point, each of the pulses is narrowed, directly proportional to the percentage modulation desired for the output waveform. This a majority of the pulses being so narrowed.

The circuit of the PWM waveform generator 11 shows that the frequency and amplitude controlling means combine to establish the width of each pulse directly proportional to the value of the respective step data, and directly proportional to the percent of modulation desired on the output waveform. The amplitude controlling means includes means to clock the PWM counter at a variable rate, and at a frequency inversely proportional to the desired effective amplitude of the output waveform 37A or 37B. Where the load 37 is a variable load, if the load decreases, the voltage across the load will momentarily increase, which increases the DC analog feedback 40, increasing the frequency of the oscillator 22, to decrease the percentage of modulation, and hence the voltage applied to the load 37.

In an actual circuit constructed in accordance with the invention, the circuit components were as follows:

| Clock 12 | CD 4046 |
|---|---|
| Counter 13 | 74LS393 |
| Eprom 15 | 2716 |
| Counter 17 | 74LS193 |
| Flip-Flop 19 | 74LS74 |
| Oscillator 22 | 74123 |
| Exclusive OR 25 | 74LS86 |
| Inverter 26 | 74HC14 |

Only a single set of values need be placed in the ROM 15, eight values in the example, and sixty-four in the actual circuit. This is far less than in the prior art, which required one set of values for each percentage of modulation desired, which required a very large memory and a complicated circuit to address such memory. As a result, the circuit here is greatly simplified.

The ROM 15 has step data therein for at least a portion of the desired output waveform, in this case 180°, and the polarity switch 25 effects the reversal of the PWM output to provide the full 360° output waveform.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of the circuit and the combination and arrangement of circuit elements may be resorted to without departing from the spirit and the scope of the invention as hereinafter claimed.

What is claimed is:

1. A pulse width modulated waveform frequency generator comprising in combination:
    frequency controlling means including means to establish a series of pulses of substantially constant amplitude and of a width directly in accordance with data of the amplitude of steps of a desired output waveform at a selected frequency; and amplitude controlling means connected to modify the output of said frequency controlling means to proportionally control the width of said pulses with respect to said data controlled width so that a desired effective amplitude is directly proportional to said modified width, whereby a modified amplitude waveform frequency is generated.

2. A PWM waveform frequency generator as set forth in claim 1, wherein said frequency controlling means establishes two consecutive pulses at the peak of the output waveform that are merged together for 100% modulation.

3. A PWM waveform frequency generator as set forth in claim 2, wherein said amplitude controlling means establishes said two consecutive pulses as being separated directly proportional to the amount the percentage of modulation is less than 100%.

4. A PWM waveform frequency generator as set forth in claim 1, wherein said amplitude controlling means establishes pulses narrowed directly proportional to the percentage modulation desired for said output waveform, except for those pulses establishing zero output voltage.

5. A PWM waveform frequency generator as set forth in claim 1, wherein said frequency and amplitude controlling means combine to establish the width of each pulse directly proportional to the value of the respective step data and directly proportional to the percent of modulation desired on the output waveform.

6. A PWM waveform frequency generator as set forth in claim 1, wherein said frequency controlling means includes a counter and means to load said step data in said counter, and said amplitude controlling means includes means to clock said counter at a variable rate.

7. A PWM waveform frequency generator as set forth in claim 6, wherein said counter clocking means is at a frequency inversely proportional to the desired effective amplitude of the output waveform.

8. A PWM waveform frequency generator as set forth in claim 6, wherein said counter clocking means includes a variable frequency oscillator.

9. A PWM waveform frequency generator as set forth in claim 6, wherein said counter clocking means include a volts-to-frequency changer.

10. A PWM waveform frequency generator as set forth in claim 9, including feedback means from the output waveform to said volts-to-frequency changer.

11. PWM waveform frequency generator as set forth in claim 6, wherein said loading means is a parallel address loading and said clocking means establishes a serial output to control said output waveform.

12. A PWM waveform frequency generator as set forth in claim 11, including a flip-flop connected to said serial output.

13. A PWM waveform frequency generator as set forth in claim 12, including a polarity switch connected to the output of said flip-flop and the polarity switch output establishes at least a portion of said output waveform.

14. A PWM waveform frequency generator as set forth in claim 13, including an inverter connected to the output of said polarity switch to establish another portion of said output waveform.

15. A PWM waveform frequency generator as set forth in claim 1, wherein said frequency controlling means establishes a PWM wave output which has an effective amplitude at any given instant which simulates the amplitude of the steps in the data.

* * * * *